United States Patent [19]

Breckel

[11] 4,305,037

[45] Dec. 8, 1981

[54] ARRANGEMENT FOR MEASURING THE CONDUCTION ANGLE OF AN IGNITION COIL IN A BATTERY-POWERED IGNITION SYSTEM

[75] Inventor: Werner Breckel, Wendlingen, Fed. Rep. of Germany

[73] Assignee: Robert Bosch GmbH, Stuttgart, Fed. Rep. of Germany

[21] Appl. No.: 39,567

[22] Filed: May 15, 1979

[30] Foreign Application Priority Data

May 15, 1979 [DE] Fed. Rep. of Germany ....... 2827347

[51] Int. Cl.³ ........................ F02P 17/00; G01R 19/00

[52] U.S. Cl. .................................... 324/386; 307/358; 324/102; 324/392

[58] Field of Search ............... 324/386, 379, 102, 392; 307/358

[56] References Cited

U.S. PATENT DOCUMENTS

| | | | |
|---|---|---|---|
| 3,692,983 | 9/1972 | Cucciati et al. | 307/358 |
| 4,109,195 | 8/1978 | Palmer | 324/386 |
| 4,187,461 | 2/1980 | Cox | 324/102 |

*Primary Examiner*—Ernest F. Karlsen

*Attorney, Agent, or Firm*—Michael J. Striker

[57] ABSTRACT

An instrument of the type employed to measure the conduction angle of the ignition coil of the battery-powered ignition system of an internal combustion engine comprises input connectors which are connected to terminals of such ignition system and an evaluating circuit which generates a signal corresponding to the conduction angle to be measured by ascertaining whether an input signal derived from the input connectors rises above or falls below a predetermined threshold voltage level. For differing types of conventional ignition systems, differing threshold voltage levels are required, but instead of resorting to manual switchover to such different levels, the instrument of the invention modifies the threshold voltage level employed in automatic dependence upon the value of the input signal derived by the input connectors. The threshold voltage level assumes a first value when coil conduction ceases and a second value when coil conduction recommences. A signal-storing circuit generates signals indicating whether or not the input voltage reaches or fails to reach a predetermined value, the predetermined value being indicative of what type of ignition system is involved, and then persistently stores such signal, the stored signal serving to automatically change at least one of the aforementioned first and second values.

4 Claims, 5 Drawing Figures

ARRANGEMENT FOR MEASURING THE CONDUCTION ANGLE OF AN IGNITION COIL IN A BATTERY-POWERED IGNITION SYSTEM

BACKGROUND OF THE INVENTION

The present invention concerns instruments which measure the conduction angle of ignition coils in battery-powered ignition systems for internal combustion engines, especially for example vehicular engines. Instruments of the type here in question typically comprise means for deriving voltages from the ignition system itself and include evaluating circuitry or converting such derived voltages into an indication or display of the conduction angle of the ignition coil.

Federal Republic of Germany published patent application DE-OS 24 43 402 discloses an arrangement for measuring the conduction angle of an ignition-system ignition coil, the input circuitry of the electrical instrument comprising a protective circuit and connected to the output of the latter an operational amplifier operative through the intermediary of a filter for controlling a second operational amplifier, which latter in turn actually generates a signal providing the desired indication of coil conduction angle. One input of the first operational amplifier is connected to a voltage divider and maintained at a constant level. Also, both inputs of the operational amplifier are protected against excessively high voltage by means of protective diodes. This known instrument provides an exact measurement of conduction angle. However, when this measurement is to be from time to time performed on ignition systems of various differing conventional types—e.g., elementary ignition systems in which interrupter contacts open to directly interrupt ignition-coil current; germanium or silicon transistor electronic ignition systems; regulated current transistorized ignition systems; capacitor ignition systems incorporating silicon-controlled rectifiers or switches—, it is necessary to switch over the input of the operational amplifier from one voltage level to another, in order that the measurement of coil conduction angle be properly performed for the particular type of conventional ignition system involved. These switchovers of voltage level are performed manually by the technician using the instrument.

SUMMARY OF THE INVENTION

It is a broad concept of the invention to provide an instrument of the type in question for measuring coil conduction angle so designed that the instrument automatically set itself or otherwise inherently take into account the differing voltages which it receives from differing types of conventional ignition systems, so that the technician not be bothered to perform the manual switchovers required in the prior art, and likewise to preclude the possibility of inaccurate measurements, and related problems, resulting from failure of the technician to remember to perform the manual switchover or inadvertent switchover to a voltage level other than the one actually needed for the ignition system involved. It is a concept of the invention that the instrument itself recognize, from the voltages which it receives, what type of conventional ignition system is involved and automatically set the voltage level of the input-circuit operational amplifier of the evaluating circuitry, or other equivalent circuit stage, appropriately.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Internal combustion engines, especially those used in automotive vehicles, are provided with ignition systems of various differing conventional types. For example, in elementary ignition systems, an interrupter contact is connected to carry the primary current of the ignition coil, i.e., is connected in the current path of the primary winding of the ignition transformer, and when the interrupter contact opens it directly interrupts the primary current of the ignition coil inducing the requisite ignition voltage. In contrast, with various types of transistorized ignition systems, the interrupter contact merely serves as a control-current carrier, and opens or closes to apply signals to solid-state switches which in turn interrupt or reestablish ignition coil current flow. Likewise, transistorized ignition systems and similarly systems of the ignition-capacitor type may not even contain such interrupter contacts, but instead comprise Hall-element transducers or inductive transducers operative for establishing the moments at which ignition-coil current is to be interrupted and/or reestablished. The conduction angle of an ignition coil or ignition transformer is the duration of the time interval, normalized with respect to the duration of one revolution of the engine's distributor shaft, during which primary current flows from the system's battery through the primary winding of the ignition coil.

The input circuitry of instruments used to measure conduction angle are connected to terminals of the ignition system involved via a first connecting line and a second connection line. The first connecting line is connected either to the 15-terminal of the ignition system or else to the positive terminal of the system's battery (assuming that the negative battery terminal is connected to ground, or otherwise to the negative battery terminal); the second connecting line of the instrument's input circuitry is connected to the 1-terminal of the ignition system or else to the system's interrupter contact or else the rpm-indicating output of the system's switching device. The expressions "1-terminal" and "15-terminal" are conventional designations of ignition-system terminals in automotive technology.

Figure 1A:
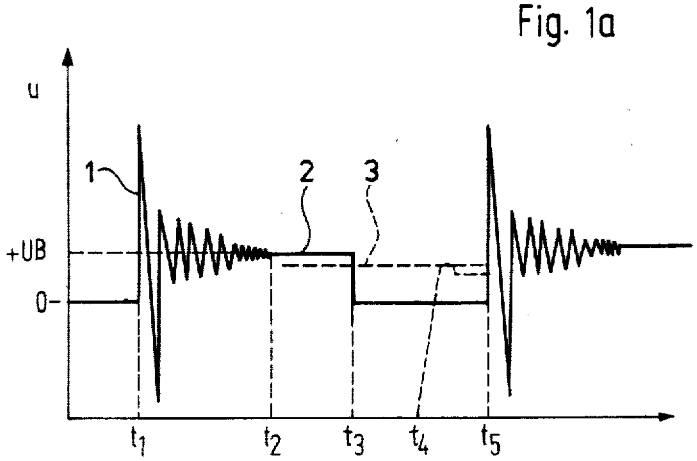
FIGS. 1*a*–1*d* are voltage diagrams which indicate the input voltages which the inventive instrument receives, when differing types of conventional ignition systems are involved, and also the threshold-voltage levels which the instrument automatically sets for itself in such differing cases.

FIG. 1*a* depicts the voltage waveform appearing at the 1-terminal of the ignition coil of a conventional ignition system of the type having an interrupter contact which carries the coil's primary-winding current. Initially, i.e., with the interrupter contact closed, the voltage at the 1-terminal, measured with reference to ground, amounts to 0 volts, because the interrupter contact itself constitutes a virtual short-circuit to ground. At time instant $t_1$, the interrupter contact opens, resulting in an abrupt change of the current flowing through the ignition coil's primary winding and a voltage waveform 1. This voltage 1 can reach a peak value of from 100 to 400 volts in the case of a 12-volt ignition system, exhibits the form of a damped oscillation, and then converts over into a constant voltage at region 2, this constant voltage amounting to about 12 volts and beginning at time instant $t_2$. At time $t_3$, the interrupter contact closes again, as a result of which the voltage at the system's 1-terminal drops down from about the battery-voltage level ($+U_B$) back down to about 0 volts. At time $t_5$, the next ignition operation occurs, analogous to time $t_1$. The instruments conventionally employed hitherto utilized a threshold voltage level 3 differing by about 1.2 volts from the system's battery voltage, or from the system's 15-terminal to which the battery voltage is applied. Accordingly, the circuitry of such instruments issue a signal indicating the start of the closing angle when, at time $t_3$, the measured voltage falls below the battery voltage level by an amount more than 1.2 volts. Conversely, such instruments issue a signal indicating the end of the closing angle when, at time $t_5$ or $t_1$, the interrupter contact opens and exceeds the instrument's threshold voltage level 3 as the 1-terminal voltage of the system surges to high values.

This voltage-waveform situation applies both to elementary interrupter-contact systems and also to conventional germanium-transistor systems. However, if a regulated-current silicon-transistor ignition system is involved, then the 1-terminal voltage of the system rises back up already at time instant $t_4$ and then, as indicated by the broken-line curve in FIG. 1*a*, remains at a level which is about 2.4 volts below the voltage level indicated in region 2 in FIG. 1*a*. No adjustment of the instrument's input circuitry would be required to measure coil conduction angle for such an ignition system, if it could somehow be assured that the rising flank of the 1-terminal voltage commencing at time $t_4$ not overshoot the instrument's threshold voltage level 3 of FIG. 1*a* and trigger an erroneous response.

Figure 1B:
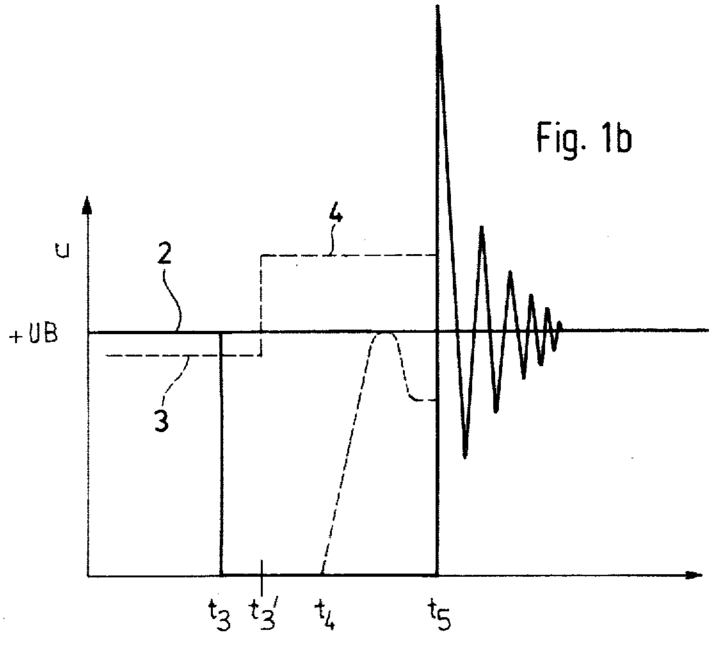

FIG. 1*b* depicts an instrument threshold voltage level design which can cover both situations just described. In region 2, the instrument's threshold voltage level 3 is the same as in FIG. 1*a*, i.e., such that a signal indicating the start of the coil conduction angle be generated in response to the system's 1-terminal voltage dropping down, by an amount in excess of about 1.2 volts, below the level of the 1-terminal voltage in region 2, i.e., dropping down to a level more than about 1.2 volts below battery voltage level $+U_B$. However, in FIG. 1*b*, about 0.6 ms later, the instrument's threshold voltage level is lifted up to a level about 3 volts above the ignition system's operating voltage level $+U_B$, as indicated at 4 in FIG. 1*b*. Accordingly, an instrument whose threshold voltage level is automatically lifted up to level 4 at time $t_3'$ as shown in FIG. 1*b*, will be able to cope with the 1-terminal voltage waveform of a regulated-current silicon-transistor ignition system, because it will not erroneously respond to the voltage rise which begins at time $t_4$, but without modification it can also be used for the 1-terminal voltage waveform depicted in solid lines in FIG. 1*a* for a more elementary ignition system. As already indicated, the time interval between $t_3$ and $t_3'$ amounts to approximately 0.6 ms.

Figure 1C:
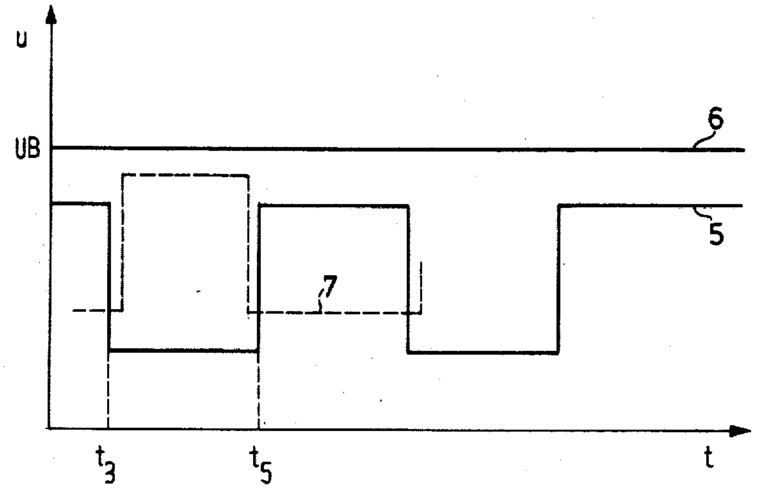

FIG. 1*c* depicts the situation for an ignition system of the silicon-transistor or ignition-capacitor type, in which the interruper contact, or the equivalent, does not carry the ignition coil's primary current but instead merely controls the conduction state of electronic switches. The first connecting line of the input circuitry of the instrument is then connected to the positive battery terminal of the ignition system or else to the positive terminal of the system's switching stage; the second connecting line is then connected to the interrupter contact which controls the system's switching stage or else is connected to the rpm-indicating output of the switching stage. As a result, differing voltage waveforms are received by the first and second connecting lines of the instrument, and other voltage threshold levels must be utilized. The rectangular voltage waveform which is applied to the second connecting line of the instrument's input circuitry is denoted by 5 in FIG. 1*c* and indicated in solid lines, and is measured relative to ground. The voltage applied to the first connecting line of the instrument is constant and equal to the system's battery voltage $+U_B$, or equivalently to the system's operating voltage derived from its battery voltage, and in FIG. 1*c* this voltage is represented by the solid horizontal straight line 6. The broken-line rectangular curve 7 in FIG. 1*c* represents the alternating threshold voltage level to be established for the instrument. The lowest value achieved by voltage waveform 5, relative to ground, is between about 0 and 3 volts. Here, the lower value for the instrument's threshold voltage level, relative to ground, is between about 4 and 6 volts, and the upper value for the threshold voltage level 7 is about 1.2 volts lower than the battery or operating voltage level a$+U_B$.

Figure 1D:
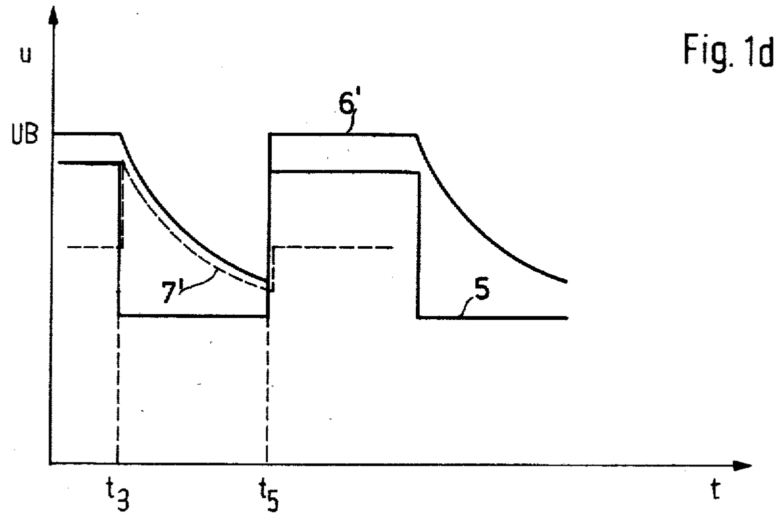

For an ignition system exhibiting the voltage waveforms depicted in FIG. 1*c*, FIG. 1*d* depicts the relationships arising when the same instrument as employed for FIG. 1*c* is differently connected. The second connecting line of the instrument's input circuitry is connected as in FIG. 1*c*. The instrument's first connecting line is connected to the 15-terminal of the ignition system's coil, and the 15-terminal is connected, now however via a series resistor, to the switch activated by the ignition system's ignition key or else to the ignition system's battery. Curve 5, representing the voltage applied to the instrument's second connecting line, is the same as in FIG. 1*c*. However, the voltage applied to the instrument's first connecting line now decreases exponentially, starting at time $t_3$, i.e., no longer corresponds to the horizontal straight line 6 of FIG. 1*c* but instead to the curve 6' of FIG. 1*d*. In correspondence thereto, the instrument's threshold voltage level exponentially decreases as indicated at 7', within the time interval between $t_3$ and $t_5$, staying at about 1.2 volts below the voltage applied to the first connecting line (curve 6') during this exponential decrease. Shortly before reaching time instant $t_5$, the difference between first-connecting-line voltage 6' and the lower value of the second-connecting-line voltage 5 can decrease to an amount as low as about 1.5 volts.

Figure 2:
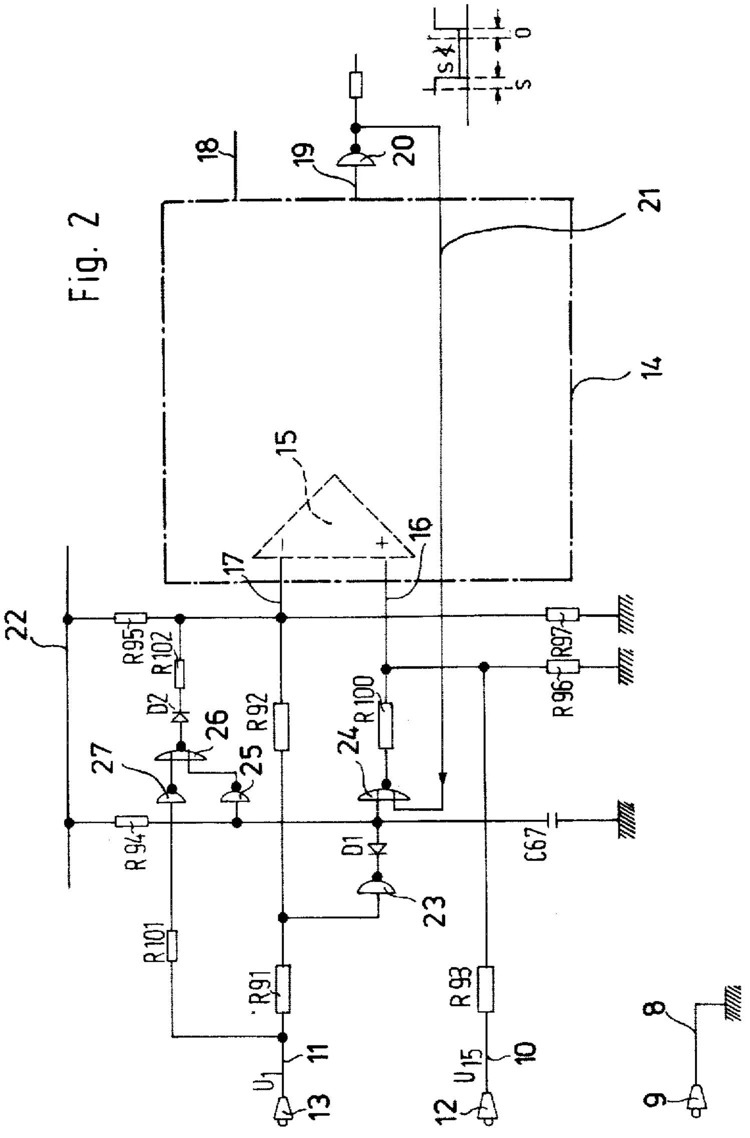
FIG. 2 is a circuit diagram depicting the configuration of the preferred but nevertheless merely exemplary embodiment of the invention.

FIG. 2 depicts the inventive input circuitry used, in accordance with a presently preferred embodiment of the invention, for an instrument which is to be able, automatically and without user intervention, to adapt itself or cope with the various possibilities illustrated in FIG. 1*a*–1*d*. The input circuitry has two inputs and two outputs, and also a common ground connection. The connection to the engine's ground or to the ground of the vehicle provided with such engine is effected by means of a connecting line 8 having a clip 9. The first and second connecting lines 10, 11 already referred to are provided with respective connector clips 12, 13, for connection to appropriate terminals of the ignition system involved. The two outputs of the illustrated input circuitry are connected to respective ones of two inputs of a schematically represented evaluating circuit 14, e.g., of the type described in Federal Republic of Germany published patent application DE-OS 24 43 402. Such evaluating circuits are conventional and will be familiar to persons skilled in the art. The internal circuitry of the evaluating circuit 14 is here illustrated only to the extent of its input operational amplifier 15, having a non-inverting input 16 and an inverting input 17. Evaluating circuit 14 has a trigger output 18 at which is produced a positive pulse flank when the ignition system's interrupter contact or switch opens, i.e., at the end of the ignition coil's conduction angle. Evaluating circuit 14 has a further output 19 connected to the input of an inverter here constituted by a NAND-gate 20. NAND-gate 20 produces at its output a pulse whose duration is proportional to the duration of the coil conduction angle, although the leading and trailing flanks of the pulse produced at the output of NAND-gate 20 are both shifted relative to the start and termination of ignition-coil conduction, and by equal amounts at both flanks of such pulse. A feedback line 21 extends from the output of NAND-gate 20 back to the illustrated novel input circuitry.

A resistor R93 is connected in the first connecting line 10 leading to the non-inverting input 16 of operational amplifier 15, and has a resistance value about nine times as great as that of a further resistor R96 connected between non-inverting input 16 and ground. A resistor R91 corresponding to resistor R93 is connected in the second connecting line 11 and has a resistance value about fifteen times as great as that of a further resistor R92 leading to the inverting input 17 of operational amplifier 15. The inverting input 17 is additionally connected to the tap of a voltage divider comprised of resistors R95 and R97. Resistor R95 is connected to the operating-voltage line 22 of the measuring instrument and as a resistance value about 100 times as great as that of resistor R97, which latter is connected to ground. The junction between resistors R91 and R92 is connected to the input of an inverter constituted by a NAND-gate 23, to whose output is connected the cathode of a diode D1. The anode of diode D1 is connected to the junction between a resistor R94 and a capacitor C67 connected as a series circuit between operating-voltage line 22 and ground. Resistor R94 is a high-resistance resistor. The anode of diode D1 is additionally connected to one input of a NOR-gate 24, to whose other input the feedback line 21 is connected. The output of NOR-gate 24 is connected via a resistor R100 to the non-inverting input 16 of the operational amplifier 15. The anode of diode D1 is furthermore connected to the input of an inverter constituted by a NAND-gate 25, whose output is connected to one input of a NOR-gate 26. The output of NOR-gate 26 is connected, via the series connection of a diode D2 and a resistor R102, to the inverting input 17, the anode of diode D2 being connected to the output of NOR-gate 26 and its cathode via resistor R102 to inverting input 17. The other input of NOR-gate 26 is connected to the output of an inverter constituted by a NAND-gate 27, whose input is connected via a resistor R101 to the second connecting line 11 of the instrument.

Assume that an elementary interrupter-contact or a transistorized ignition system is involved, that the connector clip 13 is affixed to the 1-terminal of the ignition system, and that the connector clip 12 is affixed to the 15-terminal or to the operating-voltage or battery terminal +B. At time $t_1$ or $t_5$, upon termination of ignition-coil primary current, the input voltage to the illustrated input circuitry of the instrument, upon reaching a starting value of at least 30 volts, exceeds the threshold voltage level of NAND-gate 23. As a result, capacitor C67, which previous to this point had charged via the resistor R94 to the voltage, typically 12 volts, of the instrument's operating-voltage line 22, now abruptly discharges via diode D1 and the output of NAND-gate 23; this is in contrast to the previous charging of capacitor C67, which occurs slowly due to the presence of the high-resistance charging resistor R94. The lowest rpm at which the instrument reliably operates is approximately 200 rpm. Accordingly, the voltage across capacitor C67 does not reach the threshold voltage levels of the gates 24, 25, their input signals remaining at logic level "0".

The "0" logic signals at the inputs of gates 24, 25 inform the illustrated input circuitry that the instrument's second connecting line 11 is connected to the ignition system's 1-terminal and that therefore the instrument's threshold voltage level must be ifted at time instant $t_3$, in order that the instrument operate reliably both in the case of an elementary interrupter-contact system and likewise in the case of a transistorized ignition system. The time-delayed raising of the instrument's threshold voltage level to the level indicated by 4 in FIG. 1*b* is here accomplished by feeding back the signal produced at the output of evaluating circuit 14, using feedback line 21. Conveniently, use can be made of the fact that the output signal produced by evaluating circuit 14 is anyway delayed relative to the time instant $t_3$. Accordingly, after NAND-gate 23 is tripped and a "0" signal is applied to one input of NOR-gate 24, as soon as a "0" signal is applied to the other input of NOR-gate 24 via feedback line 21 a "1" signal appears at the output of NOR-gate 24 and, considered as a voltage level, serves in effect to connect the left terminal of resistor 100 to operating voltage line 22 thereby raise the instrument's threshold voltage level up to the level 4 indicated in FIG. 1*b*. In automotive-vehicle contexts, this technique has the additional advantage of eliminating interference from the regulator of the vehicle's generator with a series resistor connected in the line leading to the 15-terminal of the ignition system. NAND-gate 25 serves to prevent any effect upon the inverting input 17 via the NOR-gate 26, the diode D2 and the resistor R102, because diode D2 is at this time reverse-biased and the output signal of NOR-gate 26 is a "0".

In contrast, if the voltage applied to the second connecting line 11 of the instrument does not reach the 30-volt threshold level, this informs the illustrated input circuitry of the instrument that the ignition system presently being tested is of the type comprising an electronic switching stage and that the connector clip 13 is presently connected to the control input of such switching stage or to its rpm-indicating output. Because the threshold voltage level of NAND-gate 23 is not reached, the output signal of NOR-gate 24 remains steadily at "0", i.e., because capacitor C67 fails to discharge but instead remains charged at a voltage equal to the voltage of operating-voltage line 22, this constituting a "1" logic signal for the input of NOR-gate 24. Accordingly, resistor R100 is virtually connected in parallel to resistor R96, but this does not have any particular result, inasmuch as the resistance of R100 is approximately 30 times as great as that of R96.

The illustrated input circuitry being now in this state, the change of the instrument's threshold voltage level is now implemented in accordance with FIG. 1*c* or FIG. 1*d*. When the voltage applied to second connecting line 11 reaches the threshold voltage level of NAND-gate 27, this threshold level being between 4 and 6 volts (i.e., at the lower value of the threshold voltage level 7 depicted in FIGS. 1*c* and 1*d*), a "0" logic signal is produced at the output of NAND-gate 27. A "0" logic signal is likewise present at the output of NAND-gate 25, because its input signal, namely the voltage across capacitor C67, is, as just stated, a "1" logic signal. Accordingly, the signal at the output of NOR-gate 26 is a "1" signal, and the biasing voltage applied to the inverting input 17 via diode D2 and resistor R102 is raised by an amount such that the operational amplifier 15 certainly respond. When the voltage applied to the second connecting line 11 falls below the threshold voltage level of NAND-gate 27, the output signal of NOR-gate 26 converts from "1" to "0" and diode D2 becomes reverse-biased. As a result, the threshold voltage level 7 of the instrument, depicted in FIG. 1*c*, converts from its lower value back up to its higher value, i.e., about 1.2 volts lower than operating voltage $U_B$. This upper one of the two values assumed by threshold voltage level 7 in FIG. 1*c* is established by the voltage divider R95, R97.

The exponential decline of the threshold voltage level 7' indicated in FIG. 1*d* is inherently achieved, because the voltage applied to non-inverting input 16 follows that applied to first connecting line 10 with a constant voltage difference of 1.2 volts.

It will be understood that each of the elements described above, or two or more together, may also find a useful application in other types of circuit configurations and modes of operation, differing from the types described above.

While the invention has been illustrated and described as embodied in input circuitry operative for automatically adjusting the threshold voltage level(s) of an instrument used to measure the conduction angle of an ignition system's ignition coil, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An improved instrument of the type which is used to measure the conduction angle of the ignition coil of an internal combustion engine's battery-powered ignition system and which comprises input connector means including first connecting line means for connection to a one of the ignition system's ignition coil and the positive terminal of the ignition system's battery, and ground-connection connecting line means for connection to ground, and further including second connecting line means for connection to a one of the interrupter contact and control input and rpm-indicating output of such ignition system and which further comprises evaluating circuit means including an operational amplifier having inverting and non-inverting inputs receiving an input voltage derived by the input connector means from such ignition system and operative in dependence upon the received input voltage reaching a predetermined threshold voltage level for generating an output signal corresponding to the duration of the conduction angle to be ascertained, the improvement comprising: threshold-voltage-level adjusting means connected to respond to an input voltage derived by the input connector means and connected to the evaluating circuit means and operative in dependence upon the value of the input voltage for automatically changing said threshold voltage level, the threshold-voltage-level adjusting means including a first resistor connected in series with the first connecting line means and connecting the first connecting line means to the non-inverting input and a second resistor of resistance value smaller than the first resistor connected between the non-inverting input and ground, and the threshold-voltage-level adjusting means further including a third and fourth resistor connected in series in the second connecting line means and connecting the second connecting line means to the inverting input of the operational amplifier, the fourth resistor being of small resistance value compared to the third resistor, furthermore including a voltage divider having a tap connected to the inverting input and applying a predetermined reference voltage to the inverting input and a logic-gate branch connecting the second connecting line means to the inverting input of the operational amplifier.

2. An instrument as defined in claim 1, furthermore including logic-gate means having an output connected to the non-inverting input and having first and second inputs and operative for changing the potential applied to the non-inverting input in dependence upon the signals received at the first and second inputs, the first input of the logic-gate means being connected to the junction between the third and fourth resistors, the second input of the logic-gate means being connected to receive the output signal of the evaluating circuit means.

3. An instrument as defined in claim 2, the logic-gate means comprising an inverter, a diode and a NAND-gate, the output of the NAND-gate constituting the output of the logic-gate means and furthermore including a resistor connecting the output of the NAND-gate to the non-inverting input, the input of the inverter constituting the first input of the logic-gate means and being connected to the junction between the third and fourth resistors, the diode connecting the output of the inverter to a first input of the NAND-gate, the NAND-gate having a second input constituting the second input of the logic-gate means and being connected to receive the output signal of the evaluating circuit means, the threshold level adjusting means furthermore incuding the series connection of a charging capacitor and a charging resistor, the junction between the charging capacitor and the charging resistor being connected to the first input of the NAND-gate.

4. An instrument as defined in claim 1, the logic-gate branch comprising a NOR-gate, the series combination of a diode and a resistor connecting the output of the NOR-gate to the inverting input of the operational amplifier, a first inverter having an output connected to a first input of the NOR-gate, a resistor connecting the input of the first inverter to the second connecting line means, and a second inverter having an output connected to a second input of the NOR-gate, furthermore including the series combination of a charging capacitor and a charging resistor connected together at a junction which is connected to the input of the second inverter.

* * * * *